(12) United States Patent
Pan et al.

(10) Patent No.: US 8,541,826 B2
(45) Date of Patent: Sep. 24, 2013

(54) MEMORY ARRAY STRUCTURE AND METHOD FOR FORMING THE SAME

(75) Inventors: Liyang Pan, Beijing (CN); Haozhi Ma, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/576,944

(22) PCT Filed: Jul. 10, 2012

(86) PCT No.: PCT/CN2012/078446
§ 371 (c)(1),
(2), (4) Date: Aug. 2, 2012

(65) Prior Publication Data
US 2013/0161730 A1 Jun. 27, 2013

(51) Int. Cl.
*H01L 27/108* (2006.01)
*H01L 21/8239* (2006.01)

(52) U.S. Cl.
USPC ............ 257/296; 257/331; 257/E21.655; 257/E29.262; 438/270; 438/272; 438/587

(58) Field of Classification Search
USPC .......... 257/296, 330, 331, E21.429, E21.655, 257/E29.262; 438/268, 270, 272, 587
See application file for complete search history.

(56) References Cited

U.S. PATENT DOCUMENTS

| | | | | |
|---|---|---|---|---|
| 6,104,061 A | * | 8/2000 | Forbes et al. | 257/330 |
| 6,764,901 B2 | * | 7/2004 | Noble et al. | 438/243 |
| 7,518,174 B2 | * | 4/2009 | Brown | 257/296 |
| 7,611,931 B2 | * | 11/2009 | Cheng et al. | 438/152 |
| 7,768,051 B2 | * | 8/2010 | Abbott | 257/296 |
| 2008/0093644 A1 | * | 4/2008 | Forbes | 257/296 |

* cited by examiner

*Primary Examiner* — Tuan N. Quach
(74) *Attorney, Agent, or Firm* — Houtteman Law LLC

(57) ABSTRACT

A memory array structure and a method for forming the same are provided. The memory array structure comprises: a substrate; a plurality of memory cells, each memory cell including a vertical transistor, of which a gate structure is formed in a first trench extending in a first direction; a plurality of word lines in the first direction, each word line formed in the first trench; a plurality of bit lines in a second direction, each bit line formed in lower sides of a semiconductor pillars; a plurality of body lines in the first direction, each body line having a first portion formed on the gate electrodes and a second portion covering a part of a top surface of semiconductor pillar for providing a substrate contact to vertical channel regions; and a plurality of data storage device contacts.

18 Claims, 8 Drawing Sheets

MEMORY ARRAY STRUCTURE AND METHOD FOR FORMING THE SAME

CROSS-REFERENCE TO RELATED APPLICATION

This application is a 371 of PCT/CN 12/78446 filed Jul. 10, 2012, which claims priority to and benefits of Chinese Patent Application Serial No. 201110439980.1, filed with the State Intellectual Property Office of P. R. China on Dec. 23, 2011, the entire contents of which are incorporated herein by reference.

FIELD

The present disclosure relates to semiconductor design and fabrication field, and more particularly to a memory array structure having vertical transistors and a method for forming the same.

BACKGROUND

In the field of a semiconductor particularly a memory, methods for increasing an integration level of a device include reducing a feature size of the device and improving a cell structure. However, with the feature size scaling down, a small size transistor may generate a serious short-channel effect. Therefore, another effective solution for increasing the integration level of the device is reducing an area of a memory cell under the condition of the same feature size by improving a topological structure of the memory cell. For example, a current mainstream technology in the DRAM (Dynamic Random Access Memory) field is an introduction of a 6F2 cell instead of an 8F2 cell to enhance the integration level of DRAM remarkably. FIG. 1 is a top view of a 6F2 DRAM memory cell array, and FIG. 2 is a cross-sectional view of the 6F2 DRAM memory cell array along a line HH' in FIG. 1. Referring to FIGS. 1-2, the 6F2 DRAM memory cell array comprises: a word line 2, a bit line 1, a contact 3 between a source region and the bit line, a capacitor contact 4, a channel region 5 formed between the capacitor contact 4 and the contact 3 between a source region and the bit line and covered by the word line 2, an isolation word line 2', an isolation layer 6 and a data storage capacitor 7.

Compared with the 6F2 DRAM memory cell, a 4F2 DRAM memory cell has a higher storage density, and thus each of a length and a width of the 4F2 DRAM memory cell should be 2F. Because each access transistor needs to be connected with a data storage device (i.e., the data storage capacitor in DRAM), the word line and the bit line respectively, three leading-out terminals are required for each transistor. The three leading-out terminals are led out from a surface of the transistor whose source, gate and drain are constructed horizontally. As shown in FIG. 2, for the horizontal transistor structure, the length of the memory cell is at least 3F to ensure an effective isolation between transistors in an array, and consequently the 4F2 structure can not be realized.

To effectively overcome the short-channel effect as well as a leading out difficulty of the transistor of the memory cell, one solution is an introduction of a vertical transistor structure whose source, gate and drain are constructed vertically instead of the horizontal transistor structure whose source, gate and drain are constructed horizontally. The vertical transistor is fabricated on a semiconductor pillar, that is, the gate is located on a side wall of the semiconductor pillar, while the source and the drain are located in an upper end and a lower end of the semiconductor pillar respectively. Generally, the memory device such as the data storage capacitor is located on an upper end of the transistor, while the bit line is connected with a diffusion region in a lower end of the transistor. On the premise of a same occupied area of a substrate, for the vertical transistor, an effective length of the channel may be increased by enlarging a height of the semiconductor pillar so as to overcome the short-channel effect. Moreover, because the source or the drain of the vertical transistor is located in a bottom of the vertical transistor and does not need to be directly led out from the surface of the transistor, the isolation between transistors in the array may be formed more easily.

In the vertical transistor structure, the bit line (the drain) is located in the lower end of the transistor, so that it is difficult to realize a contact between the channel and the substrate (a substrate contact for short), thus causing a series of channel floating effects to affect the transistor performance. US Patent Application Publication No. 2008/0093644, "DRAM Array, Vertical Transistor Structures, and Method of Forming Transistor Structures and DRAM Arrays" published on Apr. 24, 2008, U.S. Pat. No. 7,824,982, proposes a solution of offsetting the bit line to obtain a space required for forming the substrate contact to solve the above problem. However, the offsetting of the bit line may directly result in a smaller distance between the bit line and an adjacent transistor thereof, thus causing a bad isolation and consequently a serious crosstalk. U.S. Pat. No. 6,104,061, "Memory Cell with Vertical Transistor and Buried Word and Body Line" proposes a solution of independently forming the substrate contact in a trench spaced apart from the word line to solve the above problem. However, a process thereof is complicated and unfavorable for a large scale production.

Therefore, there is a need for a high density 4F2 DRAM memory array structure of 1T1C (One Transistor One Capacitor) having good substrate contact and simple fabrication process, in which the transistor is the vertical transistor.

SUMMARY

The present disclosure is aimed to solve at least one of the problems. Accordingly, a 4F2 memory array structure having vertical transistors and a method for forming the same are provided, thus simply realizing a substrate contact in the 4F2 DRAM memory array structure.

According to one aspect of the present disclosure, a memory array structure is provided. The memory array structure comprises: a substrate; a plurality of memory cells formed on the substrate, in which the plurality of memory cells are parallel arranged in a first direction and a second direction respectively, each memory cell including a vertical transistor which comprises: a semiconductor pillar, a gate structure which includes a gate dielectric and a gate electrode and is formed on a side wall of the semiconductor pillar, a source region and a drain region, and a vertical channel region formed between the source region and the drain region, in which the gate structure is formed in a first trench extending in the first direction and adjacent to the semiconductor pillar, one of the source region and the drain region is formed in an upper end of the semiconductor pillar and near the gate electrode, and the other is formed in a whole lower end of the semiconductor pillar; a plurality of word lines in the first direction, each word line formed in the first trench for connecting the gate electrodes; a plurality of bit lines in the second direction, each bit line formed in lower sides of the semiconductor pillars for connecting the source regions or the drain regions; a plurality of body lines in the first direction, a first portion of each body line formed on the gate electrodes and one word line, a second portion of each body line covering a part of a top surface of the semiconductor pillar for providing a substrate contact to the vertical channel regions; and a plurality of data storage device contacts, each data storage device contact formed on each semiconductor pillar for connecting a data storage device with each vertical transistor via each data storage device contact.

The vertical transistor is used in the memory array structure according to an embodiment of the present disclosure. Compared with a horizontal transistor, the vertical transistor has two advantages. Firstly, on the premise of a same occupied area of the substrate, the vertical transistor may increase an effective length of the channel region by enlarging a height of the semiconductor pillar so as to overcome the short-channel effect and achieve smaller feature size. Secondly, because the source region or the drain region of the vertical transistor is located in a bottom of the transistor and does not need to be directly led out from the surface of the transistor, the isolation between transistors in the array may be formed more easily, and an area of the memory cell may be reduced under a condition of a same feature size.

In one embodiment, a doped region having a doping type identical with that of the vertical channel region is formed in a portion of a top of each semiconductor pillar connected with the second portion of each body line. Each body line is the substrate contact. Each vertical channel region is connected with each body line via each doped region, which is equivalent to the contact of each vertical channel region with the substrate. Each doped region is formed in each semiconductor pillar. Purposes of a formation of each doped region lie in two aspects. In one aspect, because each semiconductor pillar is located between two gate electrodes, each semiconductor pillar (the vertical transistor) may be turned on under an action of one of the two gate electrodes which is close to the source region or the drain region located on the upper end of each semiconductor pillar, and may also be turned on under an action of the other gate which is close to the doped region. Although each semiconductor pillar is difficult to turn on due to a horizontal channel between the later gate and the source region or the drain region located on the upper end of each semiconductor pillar, a possibility of electric leakage caused by the fact that each semiconductor pillar is turned on from this side still exists. Therefore, an inversion of a semiconductor material of each doped region is more difficult by forming the doped region, thus avoiding the fact that the vertical transistor is turned on from this side and realizing the better isolation. In another aspect, a resistance of the doping region is small so as to allow the substrate contact to be more effective.

In one embodiment, a first isolation layer is formed between every two adjacent bit lines.

In one embodiment, a second isolation layer is formed between each gate electrode and each bit line, and between each word line and each bit line for realizing an isolation between each gate electrode and each bit line, and an isolation between each word line and each bit line. Moreover, a thicker isolation layer may be helpful to reduce a parasitic capacitance.

In one embodiment, preferably, if materials of the gate electrodes and the word lines are different, each gate electrode is formed on inner walls of each first trench and each word line is formed on each gate. Alternatively, if materials of the gate electrode and the word lines are identical, each gate electrode and each word line are integrally formed in each first trench.

In one embodiment, a third isolation layer is formed on each gate electrode and each word line.

In one embodiment, a fourth isolation layer is formed on each body line.

In one embodiment, a side wall of one or more layers is formed on each side of each body line.

In one embodiment, a fifth isolation layer is formed between every two adjacent data storage device contacts.

According to another aspect of the present disclosure, a method for forming a memory array structure is provided. The method comprises steps of: providing a substrate; forming a bit line layer and a channel layer on the substrate sequentially; forming a plurality of second trenches in a second direction, in which a bottom of each second trench is lower than a surface of the substrate; forming a first isolation layer in each second trench; forming a plurality of first trenches in a first direction, in which a bottom of each first trench is higher than the surface of the substrate but lower than a surface of the bit line layer; forming a gate structure which includes a gate dielectric and a gate electrode, and a word line in each first trench to obtain a patterned wafer; forming a second mask layer on the patterned wafer and forming a plurality of third trenches in the second mask layer in the first direction, in which a first portion of each third trench is located on the channel layer and a second portion of each third trench is located on a part of the gate electrodes and one word line; forming a body line in each third trench for providing a substrate contact to the channel layer; etching the second mask layer to form a side wall on each side of each body line and expose a part of the channel layer; forming a source region or a drain region in an upper portion of each exposed part of the channel layer so that a lower portion of each exposed part of the channel layer is a corresponding drain region or a corresponding source region to form a plurality of vertical transistors, in which each vertical transistor comprises a semiconductor pillar, a gate structure which includes a gate dielectric and a gate electrode and is formed on a side wall of the semiconductor pillar, a source region and a drain region, and a vertical channel region formed between the source region and the drain region; and forming a data storage device contact on each source region or each drain region for connecting a data storage device with each vertical transistor via each data storage device contact.

In one embodiment, after forming the plurality of third trenches, the method further comprises: doping a portion of the channel layer connected with each body line using the second mask layer as a mask to form a doped region having a doping type identical with that of the channel layer. Purposes of the doping lie in two aspects. In one aspect, because each semiconductor pillar is located between two gate electrodes, each semiconductor pillar (the vertical transistor) may be turned on under an action of one of the two gate electrodes which is close to the source region or the drain region located on the upper end of each semiconductor pillar, and may also be turned on under an action of the other gate which is close to the doped region. Although each semiconductor pillar is difficult to turn on due to a horizontal channel between the later gate and the source region or the drain region located on the upper end of each semiconductor pillar, a possibility of electric leakage caused by the fact that each semiconductor pillar is turned on from this side still exists. Therefore, an inversion of a semiconductor material of each doped region is more difficult by forming the doped region, thus avoiding the fact that the vertical transistor is turned on from this side and realizing the better isolation. In another aspect, a resistance of the doping region is small so as to allow the substrate contact to be more effective.

In one embodiment, forming the bit line layer on the substrate comprises: forming a first semiconductor layer with a first doping concentration on the substrate for forming the bit line; and forming a second semiconductor layer with a second doping concentration on the first semiconductor layer for forming the source region or the drain region. The first semiconductor layer and the second semiconductor layer have an identical doping type. The first doping concentration is higher for reducing the parasitic resistance of each bit line, and the second doping concentration may be adjusted so that the material of the source region or the drain region may be suitable for the source region or the drain region.

In one embodiment, forming the plurality of second trenches comprises: forming a patterned first mask layer on the channel layer; and forming the plurality of second trenches by etching the channel layer, the bit line layer and a part of the substrate sequentially using the first mask layer as a mask.

In one embodiment, forming the gate electrode and the word line in each first trench comprises: forming a second isolation layer in the bottom of each first trench, in which an upper surface of the second isolation layer is lower than an interface between the bit line layer and the channel layer; forming a gate dielectric on inner walls of each first trench; forming the gate electrode and the word line on the gate dielectric; and forming a third isolation layer on the gate electrode and the word line.

In one embodiment, preferably, forming the gate electrode and the word line further comprises: depositing a gate electrode material on the inner walls of each first trench to form the gate electrode; and depositing a word line material on the gate electrode material to form the word line. Alternatively, forming the gate electrode and the word line further comprises: depositing a conducting material in each first trench to form the gate electrode and the word line integrally.

In one embodiment, after forming each body line, the method further comprises: forming a fourth isolation layer on each body line.

In one embodiment, forming each data storage device contact comprises: forming a fifth isolation layer on the patterned wafer; etching the fifth isolation layer to expose each side wall, a part of the third isolation layer and each source region or each drain region to form a plurality of holes; and forming the data storage device contact in each hole.

With the memory array structure having vertical transistors and the method for forming the same according to an embodiment of the present disclosure, by offsetting the data storage device contact located on the upper end of the semiconductor pillar of the vertical transistor, the substrate contact is formed on the upper end of the semiconductor pillar, thus simply realizing the DRAM memory array having the substrate contact. Therefore, the short-channel effect of the horizontal transistor is overcome, and the channel floating effect of a conventional vertical transistor is avoided, thus improving a device performance. Moreover, by forming the doping region in the portion of the top of each semiconductor pillar connected with each substrate contact, an influence on a selected transistor caused by an adjacent transistor thereof is avoided, thus reducing electric leakage. Furthermore, the contact resistance between the channel region and the substrate contact is further reduced, thus allowing a contact between them to be more effective.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
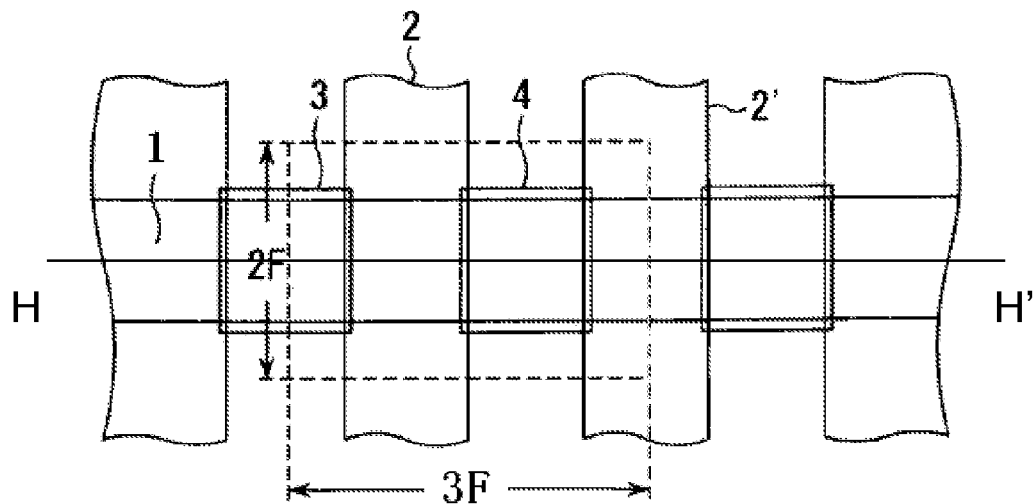
FIG. 1 is a top view of a 6F2 DRAM memory cell array.
Figure 2:
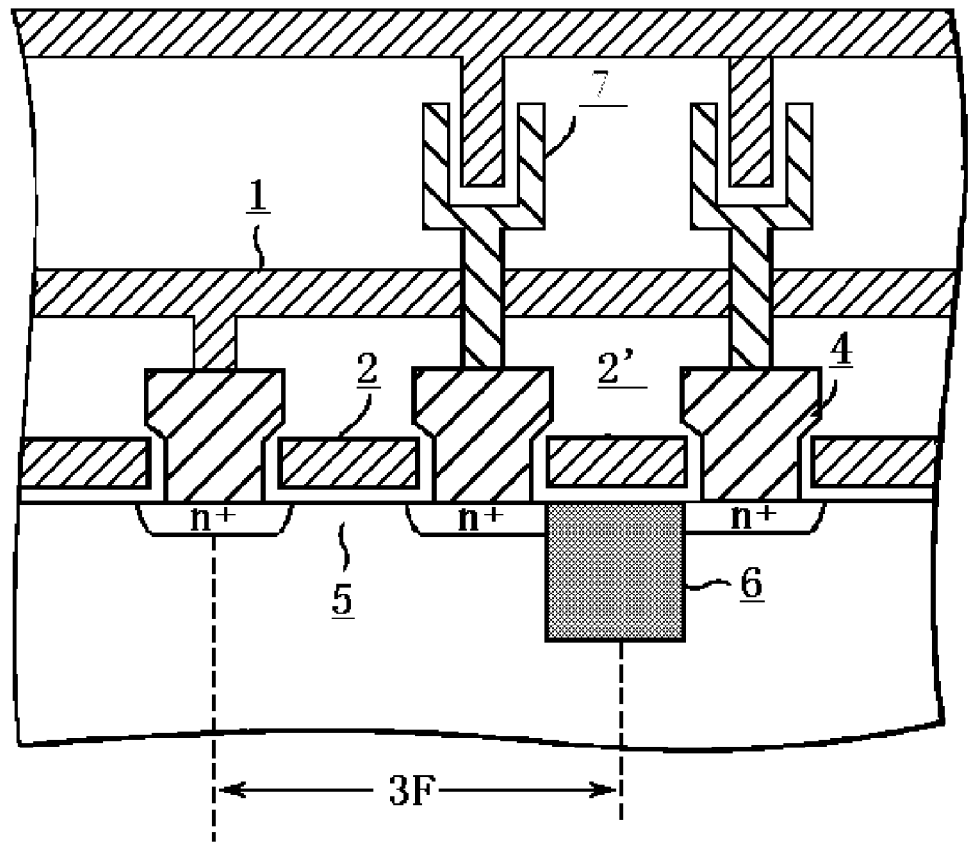
FIG. 2 is a cross-sectional view of the 6F2 DRAM memory cell array along a line HH' in FIG. 1.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation, thus not intended to limit the present disclosure.

In addition, terms such as "first" and "second" are used herein for purposes of description and are not intended to indicate or imply relative importance or significance. Therefore, a "first" or "second" feature may explicitly or implicitly comprise one or more features. Further, in the description, unless indicated otherwise, "a plurality of" refers to two or more.

Figure 3:
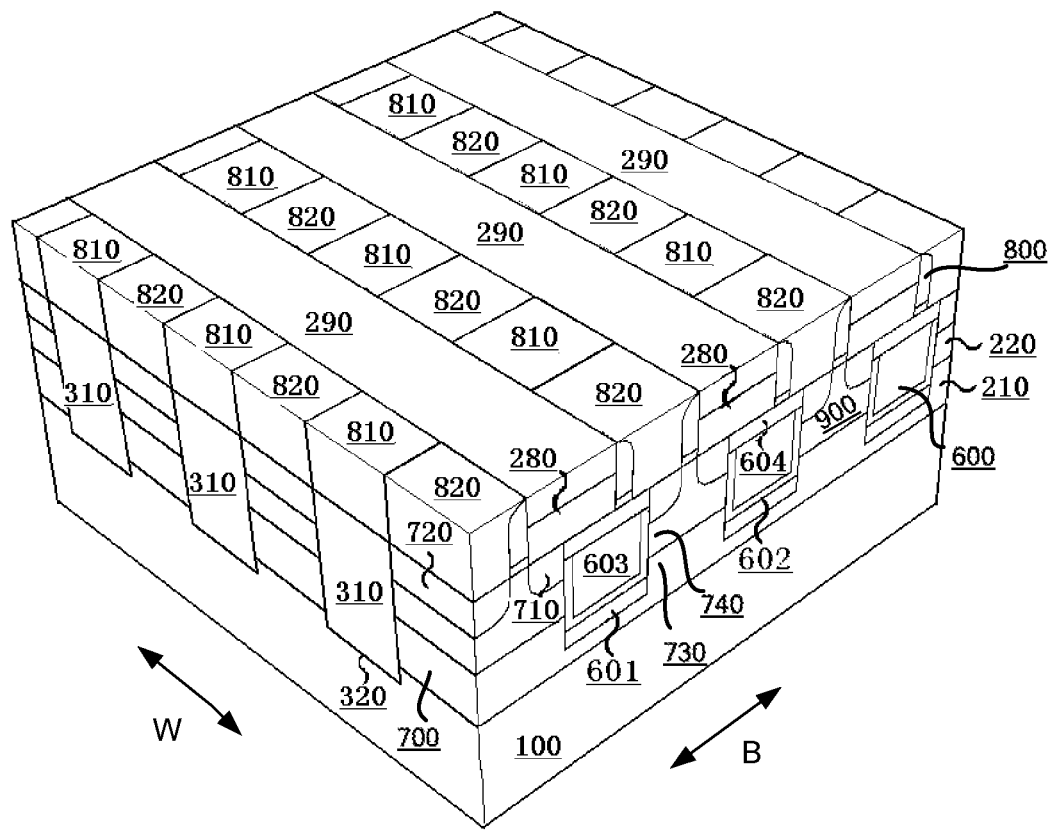
FIG. 3 is a three-dimensional schematic structural view of a memory array structure according to an embodiment of the present disclosure.

FIG. 3 is a three-dimensional schematic structural view of a memory array structure according to an embodiment of the present disclosure. As shown in FIG. 3, the memory array structure comprises: a substrate 100, a plurality of memory cells formed on the substrate 100, a plurality of word lines 603 in a first direction, a plurality of bit lines 700 in a second direction, a plurality of body lines 280 in the first direction and a plurality of data storage device contacts 820.

In some embodiments, the substrate 100 may be a semiconductor substrate, including, but not limited to, a single crystal silicon substrate, a SOI (semiconductor on insulator) substrate, a SOS (semiconductor on sapphire) substrate, a germanium substrate, a gallium arsenide substrate, or other semiconductor substrates. The substrate may be a doped or undoped semiconductor substrate, alternatively comprise an epitaxial layer, be changed by a stress to enhance a performance thereof, and may be other types of substrates.

The plurality of memory cells are parallel arranged in the first direction (i.e., a word line direction shown by an arrow W in FIG. 3) and the second direction (i.e., a bit line direction shown by an arrow B in FIG. 3) respectively to form a twodimensional array. Each memory cell includes a vertical transistor which comprises: a semiconductor pillar 900, a gate structure which includes a gate dielectric 602 and a gate electrode 603 and is formed on a side wall of the semiconductor pillar 900, a source region 720 and a drain region 730, and a vertical channel region 740 formed between the source region 720 and the drain region 730, in which the gate dielectric 602 and the gate electrode 603 are formed in a first trench 600 extending in the direction W and adjacent to the semiconductor pillar 900, one of the source region 720 and the drain region 730 is formed in an upper end of the semiconductor pillar 900 and near the gate electrode 603, and the other is formed in a whole lower end of the semiconductor pillar 900. It should be noted that a doping type of each of the source region 720 and the drain region 730 is opposite to that of the vertical channel region 740. In one embodiment, the source region 720 is formed in the upper end of the semiconductor pillar 900 and near the gate electrode 603, while the drain region 730 is formed in the whole lower end of the semiconductor pillar 900. The vertical transistor is used in the memory array structure according to an embodiment of the present disclosure. Compared with a horizontal transistor, the vertical transistor has two advantages. Firstly, on the premise of a same occupied area of the substrate, the vertical transistor may increase an effective length of the channel region by enlarging a height of the semiconductor pillar so as to overcome the short-channel effect and achieve smaller feature size. Secondly, because the source region or the drain region of the vertical transistor is located in a bottom of the transistor and does not need to be directly led out from the surface of the transistor, the isolation between transistors in the array may be formed more easily, and an area of the memory cell may be reduced under a condition of a same device size.

Each word line 603 is formed in the first trench 600 for connecting the gate electrodes 603. In one embodiment, each gate electrode may be formed on inner walls of each first trench 600, and each word line is further formed on each gate electrode, that is, each gate electrode is an outer core and each word line is an inner core, so that suitable materials of each gate electrode and each word line may be selected respectively so as to improve a device performance. In another alternative embodiment, materials of each gate electrode and each word line may be an identical conducting material to integrally form each gate electrode and each word line in each first trench 600, thus simplifying a process. For conciseness purpose, in some embodiments of the present disclosure, no matter the gate electrode and the word line formed integrally or respectively, the gate electrode and the word line may be denoted by a same reference numeral 603 in corresponding drawings and integrally denoted as "the gate electrode and word line 603" in text. In one embodiment, a third isolation layer 604 is formed on the gate electrode and word line 603 for isolating the word lines from the body lines 280 and the data storage device contacts 820.

Each bit line 700 is formed in lower sides of the semiconductor pillars 900 for connecting the drain regions 730. In one embodiment, a first isolation layer 310 is formed between every two adjacent bit lines 700 for isolating the two adjacent bit lines 700. Moreover, a second isolation layer 601 is formed between each gate electrode and word line 603 and each bit line 700 for realizing an isolation between each gate electrode and word line 603 and each bit line 700. Moreover, a thicker isolation layer may help to reduce a parasitic capacitance. Because a bottom of each first trench 600 is lower than an upper surface of each bit line 700, the lower end of each semiconductor pillar 900 is actually a portion of each bit line 700. In one alternative embodiment, materials of each the drain region 730 and each bit line 700 are identical, that is, the drain region 730 and the bit line 700 are integrally formed. In one preferred embodiment, materials of each drain region 730 and each bit line 700 are different. A doping concentration of the material of each bit line 700 is higher for reducing the parasitic resistance of each bit line 700, and a doping concentration of the material of each drain region 730 may be adjusted so that the material of each drain region 730 may be suitable for the drain region.

Each body line 280 is a substrate contact, and a material of each body line 280 may be a conducting material. A first portion of each body line 280 is formed on a part of the gate electrode and word line 603, a third isolation layer 604 is formed between each body line 280 and each gate electrode and word line 603 to realize an electrical isolation, and a second portion of each body line 280 covers a part of a top surface of the semiconductor pillar 900 to realize an electrical connection. Because an existence of the body lines 280 results in a floating of the vertical channel regions 740, in order to eliminate a negative influence on the device performance caused by the floating of the vertical channel regions 740, in some embodiments, each data storage device contact 820 located on the upper end of each vertical transistor (i.e., each source region 720) is offset for a certain distance, such as about ½ width of one semiconductor pillar 900, and each body line 280 is disposed in the direction of the word line for providing the substrate contact to each vertical channel region 740. In one preferred embodiment, a doped region 710 having a doping type identical with that of the vertical channel region 740 is formed in a portion of a top of each semiconductor pillar 900 connected with the second portion of each body line 280. Each body line 280 is the substrate contact. Each vertical channel region 740 is connected with each body line 280 via each doped region 710, which is equivalent to the contact of each vertical channel region 740 with the substrate 100. Each doped region 710 is formed in each semiconductor pillar 900. Purposes of a formation of each doped region 710 lie in two aspects. In one aspect, because each semiconductor pillar 900 is located between two gate electrodes and word lines 603, each semiconductor pillar 900 (the vertical transistor) may be turned on under an action of one of the two gate electrodes and word lines 603, which is close to the source region 720 located on the upper end of each semiconductor pillar 900, and may also be turned on under an action of the other gate electrode and word line 603, which is close to the doped region 710. Although each semiconductor pillar 900 is difficult to turn on due to a horizontal channel between the later gate electrode and word line 603 and the source region 720 located on the upper end of each semiconductor pillar 900, a possibility of electric leakage caused by the fact that each semiconductor pillar 900 is turned on from this side still exists. Therefore, an inversion of a semiconductor material of each doped region is more difficult by forming the doped region 710, thus avoiding the fact that the vertical transistor is turned on from this side and realizing the better isolation. In another aspect, a resistance of the doping region 710 is small, thus reducing a contact resistance between each vertical channel region 740 and each body line 280 so as to allow the substrate contact to be more effective. In one embodiment, a fourth isolation layer 290 is formed on each body line 280 for isolating each body line 280 from each data storage device contact 820, and a side wall 800 of one or more layers is formed on each side of each body line 280 to form an isolation between each substrate contact and each data storage device contact 820.

Each data storage device contact 820 is formed on each source region 720 on the upper end of each semiconductor pillar 900 for connecting a data storage device with each vertical transistor. The memory device is a data storage capacitor in a DRAM. In one embodiment, a fifth isolation layer 810 is formed between every two adjacent data storage device contacts 820 for isolating the two adjacent data storage device contacts 820.

With reference to FIGS. 4-20, a method for forming a memory array structure according to an embodiment of the present disclosure is described as follows. FIGS. 4-20 are cross-sectional views or top views of intermediate statuses of a memory array structure formed in steps of the method. Reference numbers in FIGS. 4-20 are corresponding to the reference numbers in FIG. 3 respectively. The method comprises following steps.

Step S01, a substrate 100 is provided. In some embodiments, the substrate 100 may be a semiconductor substrate, including, but not limited to, a single crystal silicon substrate, a SOI (semiconductor on insulator) substrate, a SOS (semiconductor on sapphire) substrate, a germanium substrate, a gallium arsenide substrate, or other semiconductor substrates. The substrate may be a doped or undoped semiconductor substrate, alternatively comprise an epitaxial layer, be changed by a stress to enhance a performance thereof, and may be other types of substrates.

Figure 4:
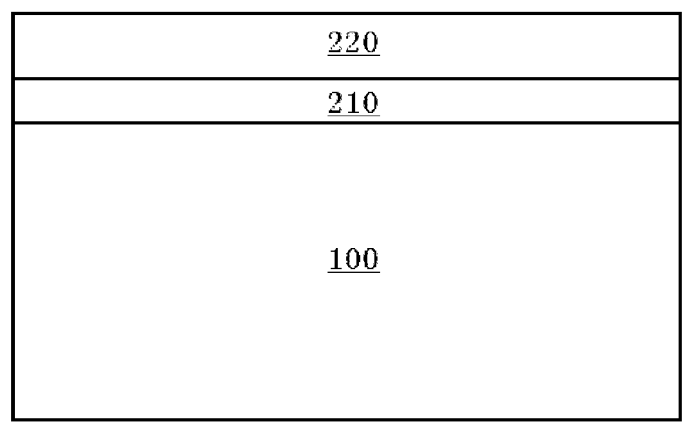
FIGS. 4-20 are cross-sectional views or top views of intermediate statuses of a memory array structure formed in steps of a method for forming a memory array structure according to an embodiment of the present disclosure.

Step S02, a bit line layer 210 and a channel layer 220 are formed on the substrate 100 sequentially, as shown in FIG. 4. Doping types of the bit line layer 210 and the channel layer 220 are opposite. In one embodiment, the bit line layer 210 for fabricating the bit line and the drain source of each transistor may be formed by an epitaxial growth of a heavily n+ doped semiconductor material such as silicon on the substrate 100. In one alternative embodiment, a portion of the bit line layer 210 is used for forming the drain source of the transistor, while another portion is used for forming the bit line, that is, the drain sources and the bit lines are actually formed integrally. In one preferred embodiment, forming the bit line layer 210 on the substrate 100 may comprise: forming a first semiconductor layer with a first doping concentration on the substrate 100 for forming each bit line; and forming a second semiconductor layer with a second doping concentration on the first semiconductor layer for forming each source region or each drain region. The first semiconductor layer and the second semiconductor layer have an identical doping type. The first doping concentration is higher for reducing the parasitic resistance of each bit line, and the second doping concentration may be adjusted so that the material of each source region or each drain region may be suitable for the source region or the drain region. In one embodiment, the channel layer 220 may be formed by an epitaxial growth of a p type semiconductor material (such as silicon) with a suitable concentration on the bit line layer 210.

Figure 5:
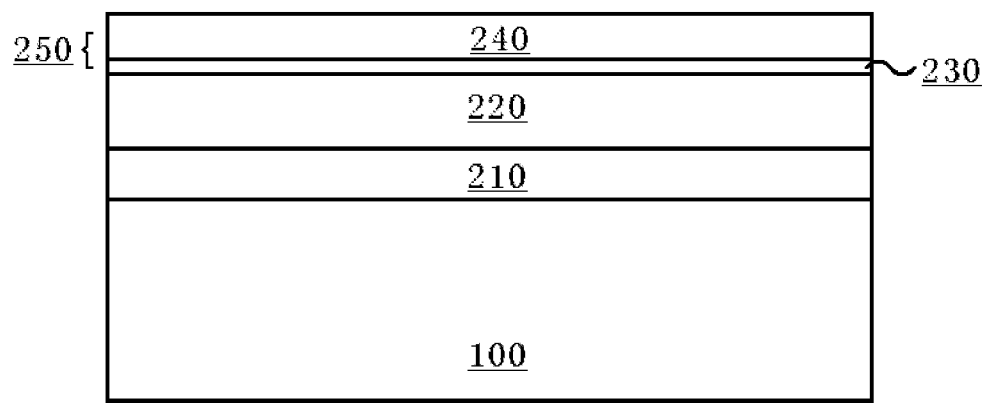
Figure 6:
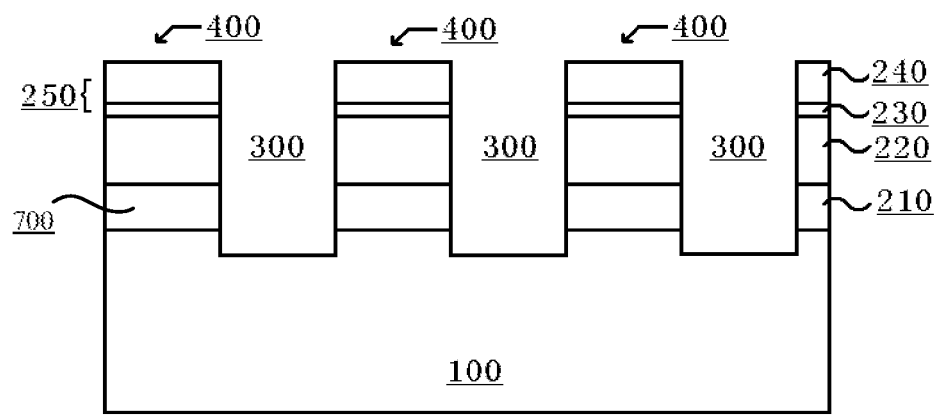

Step S03, a plurality of second trenches 300 are formed in a second direction (i.e., a direction B shown in FIG. 3), in which a bottom of each second trench 300 is lower than a surface of the substrate 100 so that a fence structure 400 extending in a direction of each bit line is formed. As shown in FIG. 6, the bit line layer 210 in the fence structure 400 is the bit lines 700 isolated from each other. In one embodiment, forming the plurality of second trenches 300 may comprise: forming a patterned first mask layer 250 on the channel layer 220, specifically, depositing a silicon oxide buffer layer 230 and depositing a silicon nitride layer 240 to form the first mask layer 250, as shown in FIG. 5, and then forming the patterned first mask layer 250 by photolithography; and forming the plurality of second trenches 300 by etching (such as reactive ion etching RIE) the channel layer 220, the bit line layer 210 and a part of the substrate 100 sequentially using the patterned first mask layer 250 as a mask, as shown in FIG. 6. A bottom of each second trench 300 is lower than a surface of the substrate 100 to form an isolation between the bit lines.

Figure 7:
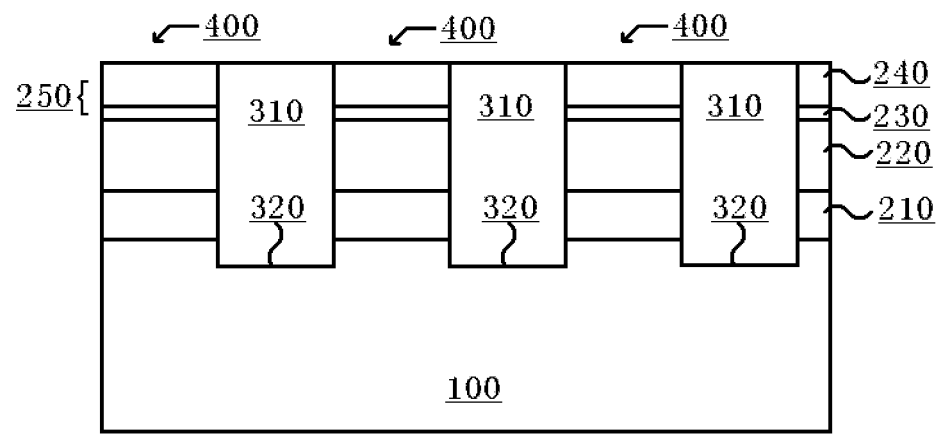

Step S04: a first isolation layer 310 is formed by filling each second trench 300, in which an interface 320 is formed between the first isolation layer 310 and the substrate 100, as shown in FIG. 7. In one embodiment, a material of the first isolation layer 310 may be $SiO_2$.

Figure 8:
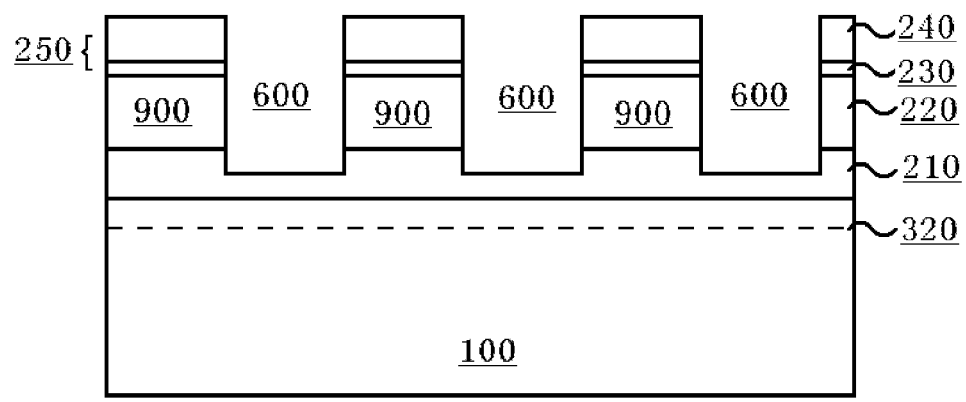

Step S05, a plurality of first trenches 600 are formed in a first direction (i.e., a direction W shown in FIG. 3), in which a bottom of each first trench 600 is higher than the surface of the substrate 100 but lower than a surface of the bit line layer 210. Thus, a plurality of semiconductor pillars 900 are parallel arranged in the first direction, as shown in FIG. 8.

Figure 9:
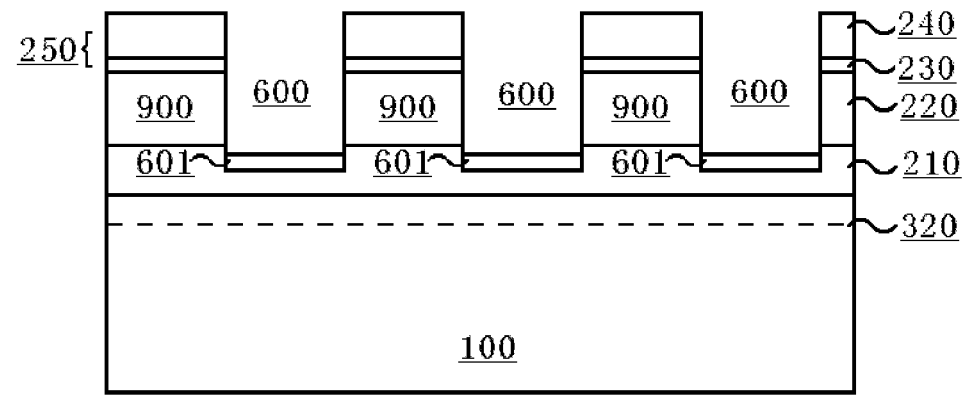
Figure 10:
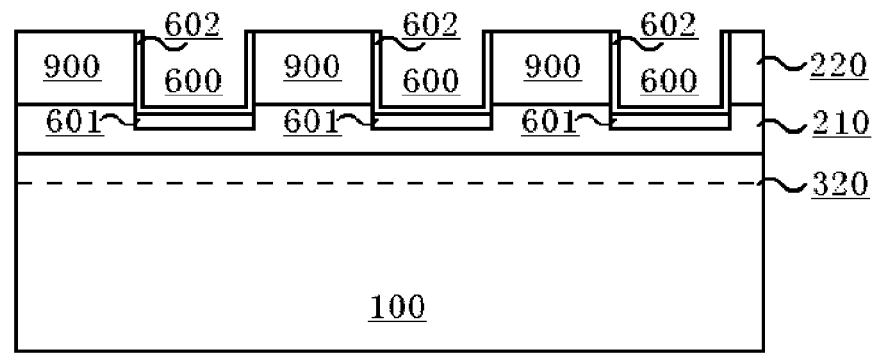
Figure 11:
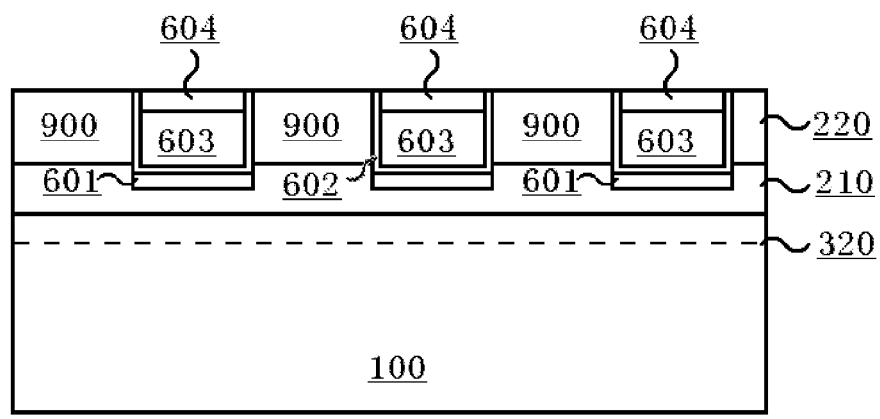

Step S06, a gate electrode and word line 603 is formed in each first trench 600 to obtain a patterned wafer. Specifically, following steps may be comprised. Firstly, a second isolation layer 601 is formed in the bottom of each first trench 600, for example, by depositing $SiO_2$, in which an upper surface of the second isolation layer 601 is lower than an interface between the bit line layer 210 and the channel layer 220, and the formation of the second isolation layer 601 may reduce the parasitic resistance between each word line and each bit line 700, as shown in FIG. 9. Secondly, the first mask layer 250 (including the silicon oxide buffer layer 230 and the silicon nitride layer 240) is removed. It should be noted that, those skilled in the art may easily understand that a step of removing the first mask layer 250 may be omitted without any influence on the final memory array structure. Thirdly, a gate dielectric 602 is formed on inner walls of each first trench 600, for example, by growing $SiO_2$ or depositing a high k dielectric material, as shown in FIG. 10. The gate dielectric 602 may be deposited by chemical vapor deposition (CVD), physical vapor deposition (PVD), pulse laser deposition (PLD), atomic layer deposition (ALD), plasma enhanced atomic layer deposition (PEALD) or other processes. Fourthly, each gate electrode and word line 603 is formed on the gate dielectric 602, in which each of upper surfaces of each gate electrode and each word line 603 is lower than an upper edge of each first trench 600. Fifthly, a third isolation layer 604 is formed on each gate electrode and word line 603 to fill a remaining part of each first trench 600 to form an electrical isolation between each gate electrode and word line 603 and each body line 280 located on each gate electrode and word line 603, as shown in FIG. 11. It should be noted that in one embodiment, materials of the gate electrodes and the word lines may be different, for example, a material of the gate electrodes may be a heavily doped polysilicon, and a material of the word lines may be a metal silicide. In this case, forming each gate electrode and each word line may further comprise: depositing a gate electrode material on the inner walls of each first trench 600 to form each gate electrode; and depositing a word line material on the gate electrode material to form each word line. In one alternative embodiment, each of materials of the gate electrodes and the word lines may be an identical conducting material, for example, a heavily doped polysilicon. In this case, each gate electrode and each word line may be formed integrally by depositing the conducting material such as a heavily doped polysilicon in each first trench 600, which may help to simplify a process.

Figure 12:
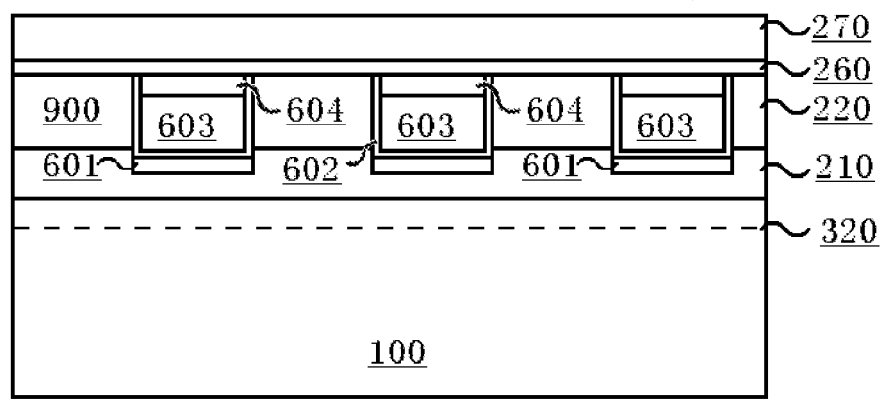
Figure 13:
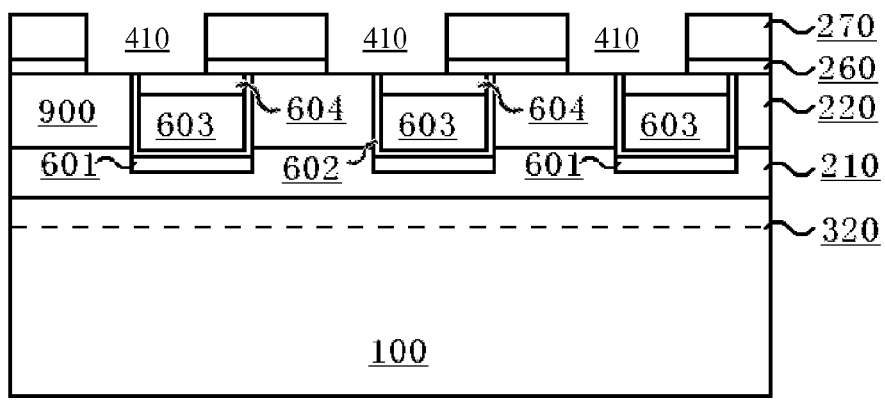

Step S07, a second mask layer is formed on the patterned wafer and a plurality of third trenches 410 are formed in the second mask layer in the first direction, in which a first portion of each third trench 410 is located on the channel layer 220 and a second portion of each third trench 410 is located on a part of the gate electrode and one word line 603, that is, the third isolation layer 604 is formed between a second part of each third trench 410 and each gate electrode and word line 603 to realize the electrical isolation, and the first portion of each third trench 410 covers a part of a top of each semiconductor pillar 900 to realize the electrical connection. In one embodiment, specifically, forming the second mask layer may comprise: depositing a silicon oxide buffer layer 260 on the patterned wafer, then depositing a silicon nitride layer 270. The silicon oxide buffer layer 260 and the silicon nitride layer 270 are used as the second mask layer, as shown in FIG. 12. Then, the second mask layer is etched to form each third trench 410, as shown in FIG. 13.

Figure 14:
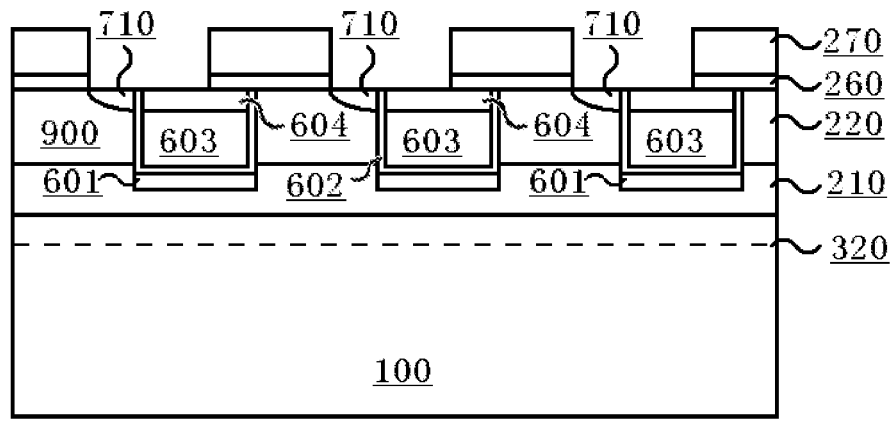

In one preferred embodiment, after forming the plurality of third trenches 410, the method may further comprise: doping a portion of the channel layer 220 connected with each body line 280 using the second mask layer as a mask to form a doped region 710 having a doping type identical with that of the channel layer 220. In one embodiment, because the doping type of the channel layer 220 is p type, p type doping may be conducted to form the p type doped region 710 in the exposed channel layer 220, as shown in FIG. 14. Purposes of a formation of each doped region 710 lie in two aspects. In one aspect, because each semiconductor pillar 900 is located between two gate electrodes and word lines 603, each semiconductor pillar 900 (the vertical transistor) may be turned on under an action of one of the two gate electrodes and word lines 603 which is close to the source region 720 located on the upper end of each semiconductor pillar 900, and may also be turned on under an action of the other gate electrode and word line 603 which is close to the doped region 710. Although each semiconductor pillar 900 is difficult to turn on due to a horizontal channel between the later gate electrode and word line 603 and the source region 720 located on the upper end of each semiconductor pillar 900, a possibility of electric leakage caused by the fact that each semiconductor pillar 900 is turned on from this side still exists. Therefore, an inversion of a semiconductor material of each doped region is more difficult by forming the doped region 710, thus avoiding the fact that the vertical transistor is turned on from this side and realizing the better isolation. In another aspect, a resistance of the doping region 710 is small, thus reducing a contact resistance between the channel layer 220 (i.e., each vertical channel region 740 shown in FIG. 3) and each body line 280 so as to allow the substrate contact to be more effective.

Figure 15:
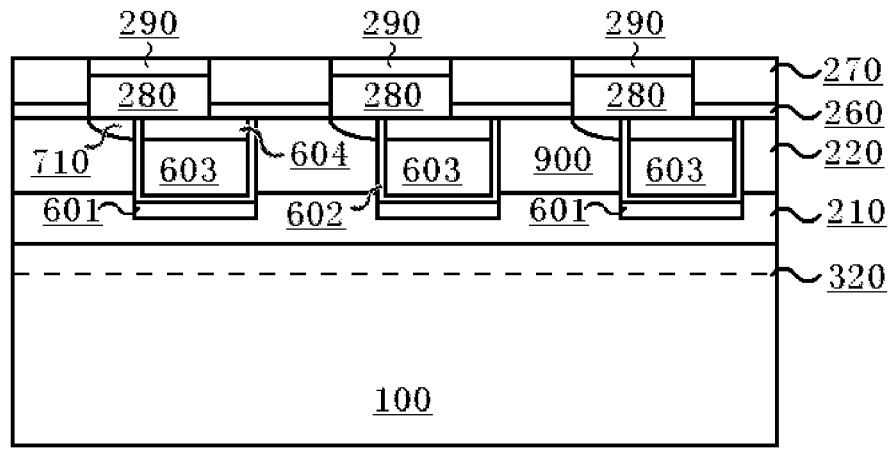

Step S08, a body line 280 is formed in each third trench 410 for providing a substrate contact to the channel layer 220. Specifically, in one embodiment, firstly, a conducting material such as polysilicon is deposited in each third trench 410 to form each body line 280; a dielectric material is further deposited on each body line 280; and then a CMP (chemical mechanical polishing) process is conducted for the patterned wafer and stopped at the silicon nitride layer 270, to form a fourth isolation layer 290 on each body line 280, as shown in FIG. 15. Preferably, a material of the fourth isolation layer 290 may be a dielectric material having a good etching selectivity with the silicon oxide layer 260 and the silicon nitride layer 270. The formation of the fourth isolation layer 290 may realize an isolation between each body line 280 and each body line 280. Each body line 280 is the substrate contact. Each channel layer 220 is connected with each body line 280 via each doped region 710, which is equivalent to the contact of each channel layer 220 with the substrate 100.

Figure 16:
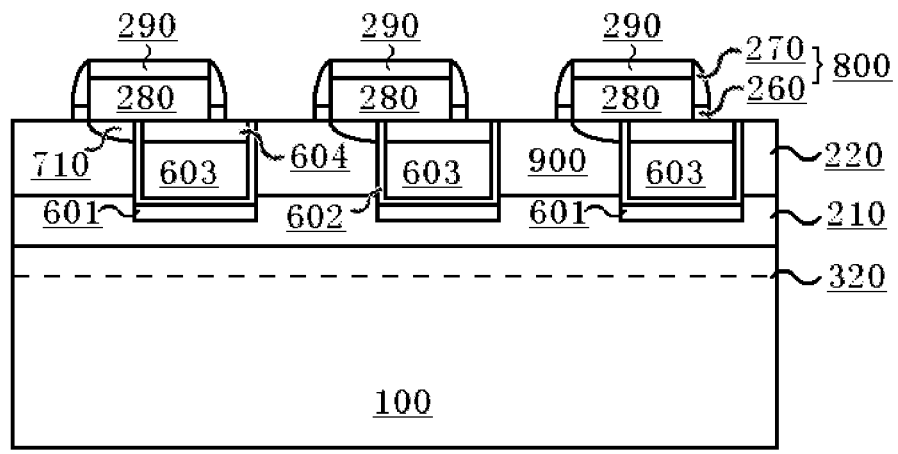

Step S09, the second mask layer is etched to form a side wall 800 on each side of each body line 280 and expose a part of the channel layer 220 (i.e. the semiconductor pillar 900), as shown in FIG. 16. In this embodiment, the side wall 800 may comprise the silicon oxide layer 260 in a lower part thereof and the silicon nitride layer 270 in an upper part thereof. Another purpose of forming the fourth isolation layer 290 lies in forming each side wall 800 by using the fourth isolation layer 290 as a mask, that is, during the etching, the second mask layer may be etched but the fourth isolation layer 290 is difficult to etch, thus forming each side wall 800.

Figure 17:
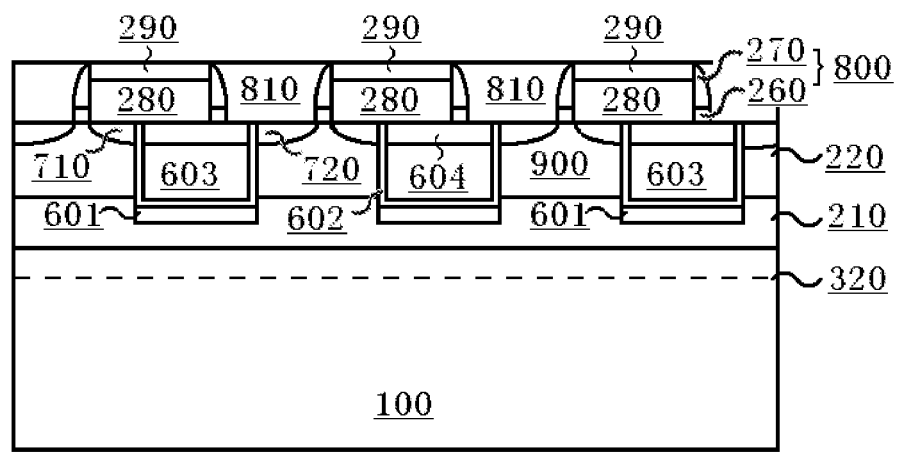

Step S10, a source region or a drain region is formed in an upper portion of each exposed part of the channel layer 220 (i.e., the upper end of the semiconductor pillar 900) so that a lower portion of each exposed part of the channel layer 220 is a corresponding drain region or a corresponding source region to form a plurality of vertical transistors. A doping type of the source region or the drain region is opposite to that of the channel layer 220. In one embodiment, n+ type doping may be conducted in the upper end of the semiconductor pillar 900 to form the source region 720 of the vertical transistor, and the lower end of the semiconductor pillar 900 is the corresponding drain region 730 of the vertical transistor. Each drain region 730 is connected with each bit line 700, and the channel region 220 between the source region 720 and the drain region 730 is a vertical channel region 740, as shown in FIG. 17.

Figure 18:
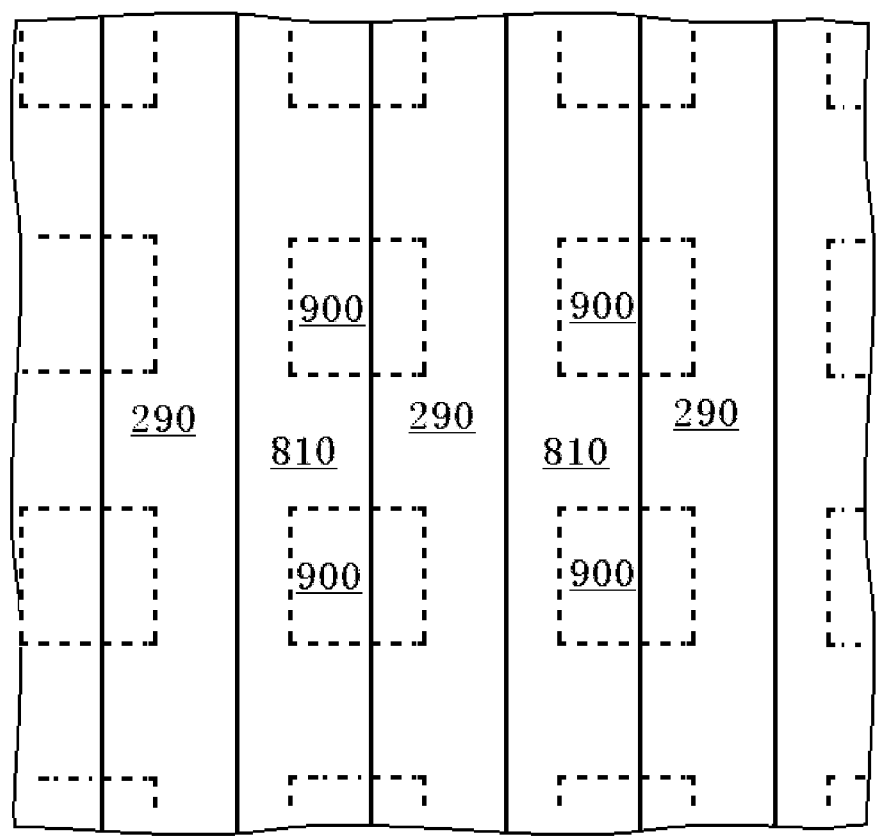
Figure 19:
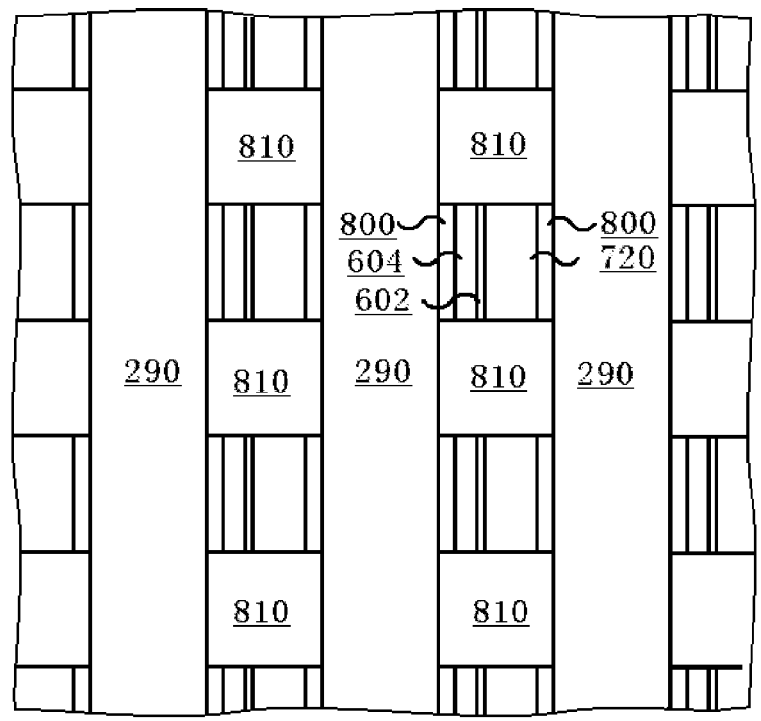
Figure 20:
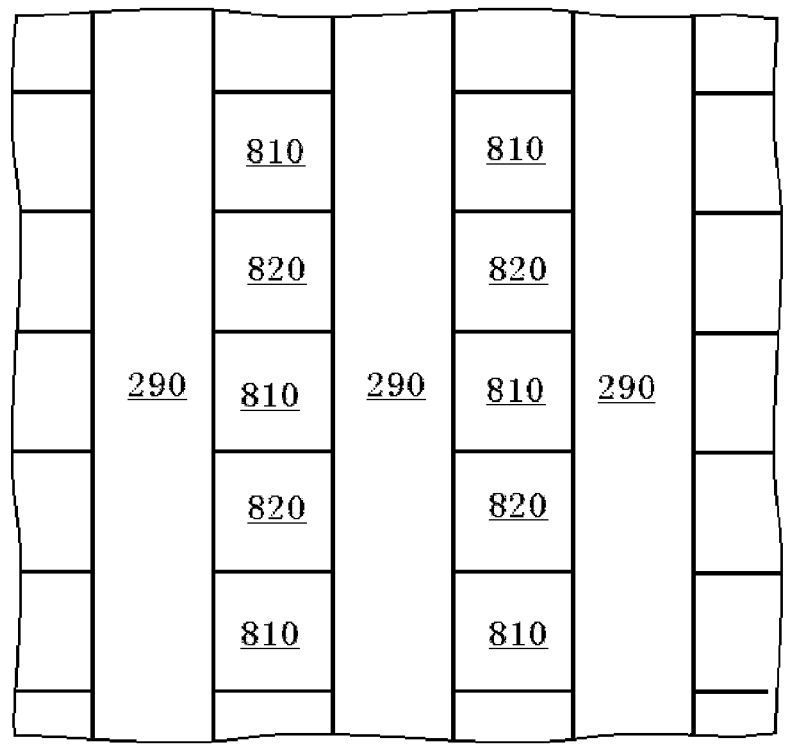

Step S11, a data storage device contact 820 is formed on each source region or each drain region for connecting a data storage device with each vertical transistor via each data storage device contact 820. In one embodiment, specifically, forming the data storage device contact 820 on each source region 720 may comprise: depositing a dielectric material such as $SiO_2$ on the patterned wafer; conducting a CMP process which is stopped at the fourth isolation layer 290, to form a fifth isolation layer 810 between two adjacent body lines 280, as shown in FIG. 18 which is a top view of the patterned wafer after the formation of the fifth isolation layer 810; etching the fifth isolation layer 810 to expose parts of the semiconductor pillar 900 to form a plurality of holes, in which the exposed parts include each side wall 800, a part of the third isolation layer 604 and each source region 720, as shown in FIG. 19 which is a top view of the patterned wafer after the formation of the plurality of holes; filling a conducting material (such as polysilicon) into each hole to form each data storage device contact 820. Each data storage device contact 820 is connected with each source region 720 to be used as a contact of a data storage device (such as a data storage capacitor in DRMA), as shown in FIG. 3 and FIG. 20, in which FIG. 20 is a top view of the transistor array structure according to an embodiment of the present disclosure.

With the memory array structure having vertical transistors and the method for forming the same according to an embodiment of the present disclosure, by offsetting the data storage device contact located on the upper end of the semiconductor pillar of the vertical transistor, the substrate contact is formed on the upper end of the semiconductor pillar, thus simply realizing the DRAM memory array having the substrate contact. Therefore, the short-channel effect of the horizontal transistor is overcome, and the channel floating effect of a conventional vertical transistor is avoided, thus improving a device performance. Moreover, by forming the doping region in the portion of the top of each semiconductor pillar connected with each substrate contact, an influence on a selected transistor caused by an adjacent transistor thereof is avoided, thus reducing electric leakage. Furthermore, the contact resistance between the channel region and the substrate contact is further reduced, thus allowing a contact between them to be more effective.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be noted by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A memory array structure, comprising:
    a substrate;
    a plurality of memory cells formed on the substrate, wherein the plurality of memory cells are parallel arranged in a first direction and a second direction respectively, each memory cell including a vertical transistor which comprises: a semiconductor pillar, a gate structure which includes a gate dielectric and a gate electrode and is formed on a side wall of the semiconductor pillar, a source region and a drain region, and a vertical channel region formed between the source region and the drain region, wherein the gate structure is formed in a first trench extending in the first direction and adjacent to the semiconductor pillar, one of the source region and the drain region is formed in an upper end of the semiconductor pillar and near the gate electrode, and the other is formed in a whole lower end of the semiconductor pillar;
    a plurality of word lines in the first direction, each word line formed in the first trench for connecting the gate electrodes;
    a plurality of bit lines in the second direction, each bit line formed in lower sides of the semiconductor pillars for connecting the source regions or the drain regions;
    a plurality of body lines in the first direction, a first portion of each body line formed on the gate electrodes and one word line, a second portion of each body line covering a part of a top surface of the semiconductor pillar for providing a substrate contact to the vertical channel regions; and
    a plurality of data storage device contacts, each data storage device contact formed on each semiconductor pillar for connecting a data storage device with each vertical transistor via each data storage device contact.

2. The memory array structure according to claim 1, wherein a doped region having a doping type identical with that of the vertical channel region is formed in a portion of a top of each semiconductor pillar connected with the second portion of each body line.

3. The memory array structure according to claim 1, wherein a first isolation layer is formed between every two adjacent bit lines.

4. The memory array structure according to claim 1, wherein a second isolation layer is formed between each gate electrode and each bit line, and between each word line and each bit line.

5. The memory array structure according to claim 1, wherein
    if materials of the gate electrodes and the word lines are different, each gate electrode is formed on inner walls of each first trench and each word line is formed on each gate electrode; or
    if materials of the gate electrodes and the word lines are identical, each gate electrode and each word line are integrally formed in each first trench.

6. The memory array structure according to claim 1, wherein a third isolation layer is formed on each gate electrode and each word line.

7. The memory array structure according to claim 1, wherein a fourth isolation layer is formed on each body line.

8. The memory array structure according to claim 1, wherein a side wall of one or more layers is formed on each side of each body line.

9. The memory array structure according to claim 1, wherein a fifth isolation layer is formed between every two adjacent data storage device contacts.

10. A method for forming a memory array structure, comprising steps of:
    providing a substrate;
    forming a bit line layer and a channel layer on the substrate sequentially;
    forming a plurality of second trenches in a second direction, wherein a bottom of each second trench is lower than a surface of the substrate;
    forming a first isolation layer in each second trench;
    forming a plurality of first trenches in a first direction, wherein a bottom of each first trench is higher than the surface of the substrate but lower than a surface of the bit line layer;
    forming a gate structure which includes a gate dielectric and a gate electrode, and a word line in each first trench to obtain a patterned wafer;
    forming a second mask layer on the patterned wafer and forming a plurality of third trenches in the second mask layer in the first direction, wherein a first portion of each third trench is located on the channel layer and a second portion of each third trench is located on a part of the gate electrodes and one word line;
    forming a body line in each third trench for providing a substrate contact to the channel layer;
    etching the second mask layer to form a side wall on each side of each body line and expose a part of the channel layer;
    forming a source region or a drain region in an upper portion of each exposed part of the channel layer so that a lower portion of each exposed part of the channel layer is a corresponding drain region or a corresponding source region to form a plurality of vertical transistors, wherein each vertical transistor comprises a semiconductor pillar, a gate structure which includes a gate dielectric and a gate electrode and is formed on a side wall of the semiconductor pillar, a source region and a drain region, and a vertical channel region formed between the source region and the drain region; and
    forming a data storage device contact on each source region or each drain region for connecting a data storage device with each vertical transistor via each data storage device contact.

11. The method according to claim 10, after forming a plurality of third trenches, further comprising:
    doping a portion of the channel layer connected with each body line using the second mask layer as a mask to form a doped region having a doping type identical with that of the channel layer.

12. The method according to claim 10, wherein forming a bit line layer on the substrate comprises:
   forming a first semiconductor layer with a first doping concentration on the substrate for forming the bit line; and
   forming a second semiconductor layer with a second doping concentration on the first semiconductor layer for forming the source region or the drain region,
   wherein the first semiconductor layer and the second semiconductor layer have an identical doping type.

13. The method according to claim 10, wherein forming a plurality of second trenches comprises:
   forming a patterned first mask layer on the channel layer; and
   forming the plurality of second trenches by etching the channel layer, the bit line layer and a part of the substrate sequentially using the first mask layer as a mask.

14. The method according to claim 13, wherein forming a gate structure which includes a gate dielectric and a gate electrode and a word line in each first trench comprises:
   forming a second isolation layer in the bottom of each first trench, wherein an upper surface of the second isolation layer is lower than an interface between the bit line layer and the channel layer;
   forming the gate dielectric on inner walls of each first trench;
   forming the gate electrode and the word line on the gate dielectric; and
   forming a third isolation layer on the gate electrode and the word line.

15. The method according to claim 10, wherein forming the gate electrode and the word line further comprises:
   depositing a gate electrode material on the inner walls of each first trench to form the gate electrode; and
   depositing a word line material on the gate electrode material to form the word line.

16. The method according to claim 10, wherein forming the gate electrode and the word line further comprises: depositing a conducting material in each first trench to form the gate electrode and the word line integrally.

17. The method according to claim 10, after forming a body line, further comprising:
   forming a fourth isolation layer on each body line.

18. The method according to claim 10, wherein forming a data storage device contact comprises:
   forming a fifth isolation layer on the patterned wafer;
   etching the fifth isolation layer to expose each side wall, a part of the third isolation layer and each source region or each drain region to form a plurality of holes; and
   forming the data storage device contact in each hole.

* * * * *